United States Patent
Gibson et al.

(10) Patent No.: US 6,518,839 B2
(45) Date of Patent: Feb. 11, 2003

(54) METHOD AND APPARATUS FOR EFFECTING PROGRAMMABLE GAIN AMPLIFICATION

(75) Inventors: Neil Gibson, Richardson, TX (US); Marco Corsi, Parker, TX (US); Philip Sean Stetson, Garland, TX (US); James D. Quarfoot, Richardson, TX (US)

(73) Assignee: Texas Instrumetns Incorporated, Dallas, TX (US)

(*) Notice: Subject to any disclaimer, the term of this patent is extended or adjusted under 35 U.S.C. 154(b) by 7 days.

(21) Appl. No.: 09/887,795

(22) Filed: Jun. 22, 2001

(65) Prior Publication Data

US 2002/0011897 A1 Jan. 31, 2002

Related U.S. Application Data

(60) Provisional application No. 60/214,838, filed on Jun. 28, 2000.

(51) Int. Cl.[7] .............................. H03F 1/14; H03F 3/45; H03F 3/68
(52) U.S. Cl. .......................... 330/51; 330/254; 330/257; 330/295
(58) Field of Search .......................... 330/51, 254, 257, 330/295

(56) References Cited

U.S. PATENT DOCUMENTS

| | | | | |
|---|---|---|---|---|
| 5,512,857 A | * | 4/1996 | Koskowich | 330/252 |
| 5,844,443 A | * | 12/1998 | Wong | 330/275 |
| 5,880,631 A | * | 3/1999 | Sahota | 330/254 |
| 6,141,169 A | * | 10/2000 | Pietruszynski et al. | 330/260 |
| 6,211,737 B1 | * | 4/2001 | Fong | 330/282 |
| 6,281,730 B1 | * | 8/2001 | Vu | 323/316 |
| 6,380,805 B1 | * | 4/2002 | Bily et al. | 330/253 |
| 6,417,737 B1 | * | 7/2002 | Moloudi et al. | 330/301 |
| 6,424,480 B1 | * | 7/2002 | Bhandari et al. | 360/67 |

OTHER PUBLICATIONS

Data Sheet, "Maxim Upstream CATV Amplifier MAX3510," Maxim Integrated Products, 19–1398; Rev. 1 Dec. 1998; pp. 1–12.

Data Sheet, "Gain Programmable CATV Line Driver AD8321," Analog Devices, Norwood, MA, Rev. 0, pp. 1–13.

Barrie Gilbert, "The Multi–tanh Principle: A Tutorial Overview," IEEE Journal of Solid–State Circuits, vol. 33, No. 1, Jan. 1998, pp. 2–17.

Barrie Gilbert, "A New Wide–Band Amplifier Technique," IEEE Journal of Solid–State Circuits, vol. SC–3, No. 4, Dec. 1968, pp. 353–365.

Barrie Gilbert, "A Precise Four–Quadrant Multiplier with Subnanosecond Response," IEEE Journal of Solid–State Circuits, vol. SC–3, No. 4, Dec. 1968, pp. 365–373.

* cited by examiner

Primary Examiner—Patricia Nguyen
(74) Attorney, Agent, or Firm—Pedro P. Hernandez; W. James Brady III; Frederick J. Telecky, Jr.

(57) ABSTRACT

A programmable gain amplifier (10) has a differential input (12–13), a differential output (16–17), and a plurality of enable inputs (21, 31–34). The amplifier includes a plurality of transconductor sections (26–29), which each have input nodes coupled to the differential input, output nodes coupled to the differential output, and an enable node coupled to a respective enable signal. The transconductor sections have different gains, which are respective powers of two. Each transconductor section includes a transconductor circuit (51, 56) which is coupled in series with at least one current mirror circuit (52–53, 57–58). Each transconductor circuit has a transistor (121) with a class A quiescent current that is proportional to the corresponding gain, the transistor being sized to achieve an optimum current density for its quiescent current. Each such transistor has two terminals coupled to other circuitry within the transconductor circuit, and a third terminal coupled only to the associated current mirror circuit.

18 Claims, 3 Drawing Sheets

METHOD AND APPARATUS FOR EFFECTING PROGRAMMABLE GAIN AMPLIFICATION

This application claims priority under 35 USC § 119(e)(1) of provisional application Ser. No. 60/214,838 filed Jun. 28, 2000.

TECHNICAL FIELD OF THE INVENTION

This invention relates in general to variable amplification or attenuation and, more particularly, to a method and apparatus for effecting programmable gain amplification.

BACKGROUND OF THE INVENTION

There are circuits in which it is useful to have an amplifier or attenuator with a variable gain, such as a programmable gain amplifier. One existing application for such a device is to provide broadband Internet access in an upstream cable modem driver for a cable modem system. One possible approach is to use a high speed multiplexer, but this introduces switches into the signal path, which degrades performance.

Another existing approach uses a Gilbert cell to implement an attenuator. A problem with this approach is that a class A quiescent current does not decrease as the output signal is attenuated. This leaves the shot noise constant as the signal level at the output falls due to attenuation, thus degrading the signal-to-noise ratio as attenuation increases. In addition, if the cell is used as an output, it has an output voltage compliance which is not entirely satisfactory. Although it is possible to use current mirrors to improve the voltage compliance, this puts more active electronics in the signal path, which in turn causes a further degradation in distortion, noise, linearity, and bandwidth.

Although such pre-existing approaches have been generally adequate for their intended purposes, they have not been satisfactory in all respects. Power consumption, noise and distortion are higher than ideally desired, as is the glitch energy which occurs at the output when the device is enabled or disabled. Further, the bandwidth is narrower than desired for an application such as an upstream cable modem driver.

SUMMARY OF THE INVENTION

From the foregoing, it may be appreciated that a need has arisen for a method and apparatus for obtaining programmable gain amplification, with some or all of the advantages of low power consumption, low noise, low glitch energy, low distortion, and high bandwidth.

According to a first form of the present invention, a method and apparatus are provided to address this need, and relate to a programmable gain amplifier which has a plurality of transconductor sections that each have an input node, an output node and an enable node. The method and apparatus involve: applying to the enable node of each transconductor section a respective one of a plurality of enable signals that can each be selectively set to have one of first and second states; applying a common input signal to the input nodes of each of the transconductor sections; causing each transconductor section to inhibit current flow at the output node thereof when the corresponding enable signal is in the first state; causing each transconductor section to produce at the output node thereof an output current when the corresponding enable signal is in the second state, the output current being proportional to a voltage of the input signal according to a gain, with the gains of the transconductor sections being different; and forming an output signal by summing the output currents from the output nodes of the transconductor sections.

According to a different form of the present invention, a method and apparatus are provided to meet the need, and relate to a transconductor circuit having an input node, an output node, and circuitry coupled between the input and output nodes. The method and apparatus involve: operating the circuitry so that it responds to an input voltage at the input node by generating an output current at the output node; and providing within the circuitry a transistor which has first, second and third terminals, the second terminal being a control terminal, the second and third terminals each being coupled to other components of the circuitry, and the first terminal serving as the output node and being free of connections within the circuitry.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
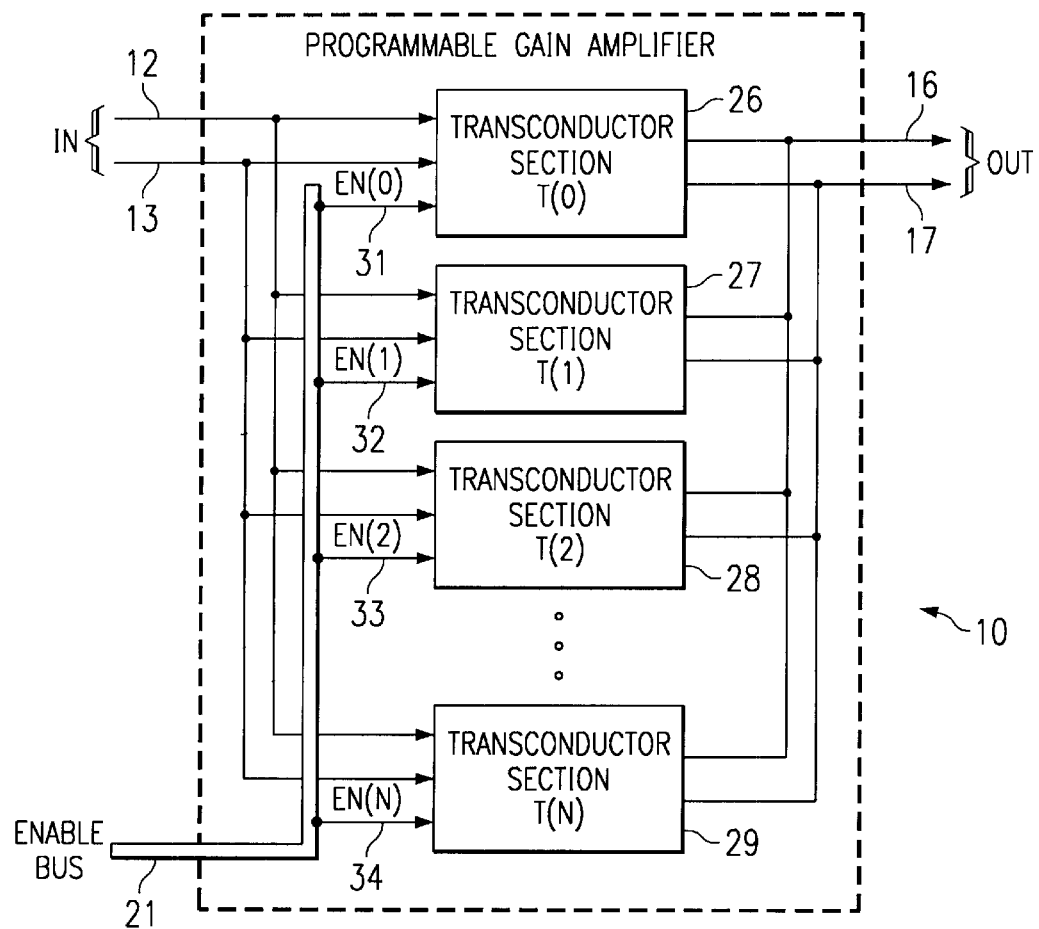
FIG. 1 is a block diagram of the circuitry of a programmable gain amplifier which embodies the present invention.

FIG. 1 is a block diagram of an apparatus which is a programmable gain amplifier circuit 10, and which embodies the present invention. The programmable gain amplifier 10 has differential input terminals at 12 and 13, and differential output terminals at 16 and 17. Further, the programmable gain amplifier 10 has N+1 enable inputs that collectively define an enable bus 21.

The programmable gain amplifier 10 includes N+1 transconductor sections, four of which are shown at 26–29. The term transconductor is used here to refer to a circuit which accepts an input signal in the form of a voltage, and which produces a corresponding output signal in the form of a current. Each of the transconductor sections 26–29 has a pair of differential input nodes, which are each connected to a respective one of the differential inputs 12 and 13 of the amplifier 10. Further, each of the transconductor sections 26–29 has a pair of differential output nodes, which are each connected to a respective one of the differential outputs 16–17 of the amplifier 10. Each of the transconductor sections 26–29 also has a single enable input, which is coupled to a respective one of the lines of the enable bus 21, four of these lines being identified in FIG. 1 by respective reference numerals 31–34.

Each of the transconductor sections 26–29 is respectively enabled and disabled when the corresponding one of the lines 31–34 of the bus 21 respectively has logic low and logic high states. When disabled, each transconductor section 26–29 effectively has its output disabled, so that its output has no effect on the differential output 16–17. Each of the transconductor sections 26–29, when enabled, accepts a differential voltage from the differential input 12–13, and outputs a differential current to the differential output 16–17.

Since the transconductor sections 26–29 each output a current rather than a voltage, the currents from the transconductor sections which are enabled are effectively summed, in order to produce the total output current that appears at the differential output 16–17. In contrast, the transconductor sections which are disabled do not contribute to or affect the current produced at the differential output 16–17 by the enabled transconductor sections.

The differential input of each transconductor section 26–29 is a high-impedance input, thereby permitting the differential inputs of all of the transconductor sections to be connected to each other and to the differential input 12–13 of the amplifier 10. Similarly, the differential output of each transconductor section 26–29 is a high-impedance output, thereby permitting the differential outputs of all of the transconductor sections to be connected to each other and to the differential output 16–17 of the amplifier 10.

The transconductor sections 26–29 are generally similar, but one difference is that each transconductor section has a different gain. In the disclosed embodiment, the transconductor sections 26–29 are configured so that their respective gains increase in magnitude by powers of two. In other words, if the transconductor section 26 has a gain of one (which is $2^0$), then transconductor section 27 has a gain of two (which is $2^1$), transconductor 28 has a gain of four (which is $2^2$), and so forth, where transconductor section 29 has a gain which is $2^N$. Thus, by appropriate control of the N+1 lines of the enable bus 21, the programmable gain amplifier 10 can implement any gain in steps of one from 1 to $2^{N+1}$.

With this in mind, if the gain of a respective transconductor section is represented by $g_{T(n)}$, and if the corresponding enable signal is represented by EN(n), then the overall gain G of the programmable gain amplifier 10 of FIG. 1 may be represented as:

$$G = \sum_{n=0}^{N} g_{T(n)} \cdot EN(n)$$

One feature of the invention, discussed in more detail later, is that each of the transconductor sections 26–29 has internal circuitry which is custom tailored for its particular operating conditions, including its respective gain. In more detail, the transconductor sections 26–29 of the disclosed embodiment have respective internal circuits that each conform to a common circuit schematic, but certain components of this common circuit have a different physical size in each of the transconductor sections. In the disclosed embodiment, the programmable gain amplifier 10 is implemented in the form of an integrated circuit, which facilitates fabrication of certain components such as transistors so that they have different physical sizes from one transconductor section to the next, even though the circuit schematics for the transconductor sections are the same.

Figure 2:
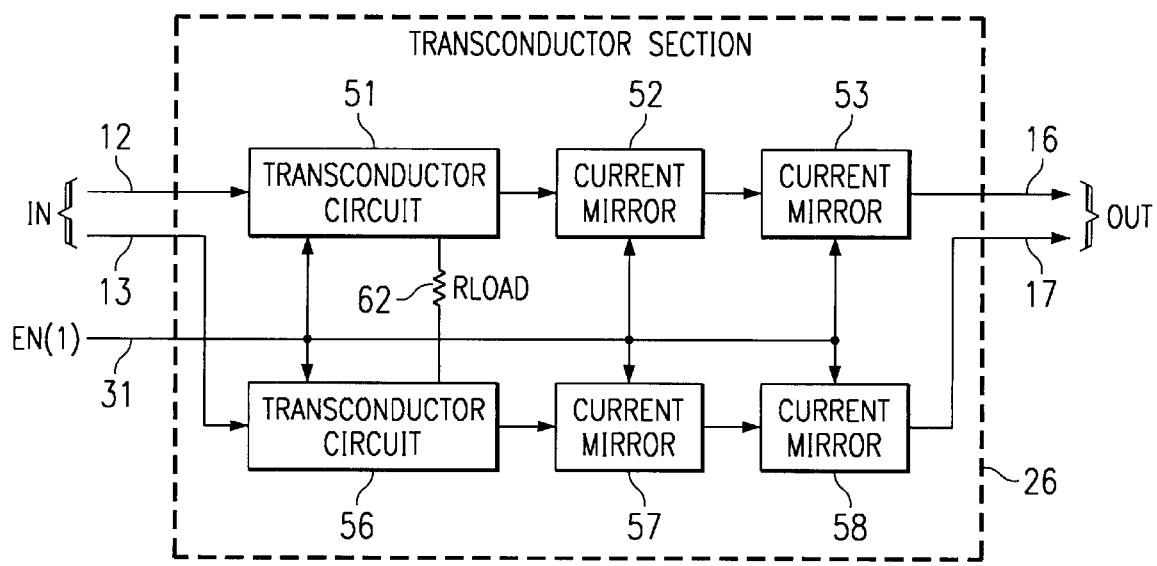
FIG. 2 is a block diagram of the circuitry of a transconductor section, which is a component of the programmable gain amplifier of FIG. 1.

Since the transconductor sections 26–29 of the disclosed embodiment all conform to a common circuit schematic, only one transconductor section is illustrated and described in detail below. In more detail, FIG. 2 is a block diagram of the internal circuitry of the transconductor section 26, and shows that the transconductor section 26 includes a transconductor circuit 51, a current mirror circuit 52 and a current mirror circuit 53 that are all coupled in series with each other between an input node corresponding to differential input 12, and an output node corresponding to differential output 16. The transconductor section 26 further includes a transconductor circuit 56, a current mirror circuit 57 and a current mirror circuit 57–58 that are all coupled in series with each other between an input node corresponding to differential input 13, and an output node corresponding to differential output 17.

A load resistor RLOAD is shown at 62, and is coupled between respective load nodes provided in each the transconductor circuits 51 and 56. Due to the differential nature of the circuit shown in FIG. 2, it will be recognized that, if the load resistor RLOAD shown at 62 was replaced with two resistors which were coupled in series and which each had half the resistance of the resistor 62, the node between these two resistors would stay at the same substantially constant voltage during operation of the disclosed circuit.

The transconductor section 26 has an enable node which is coupled to the line 31 of the enable bus 21, to each of the transconductor circuits 51 and 56, and to each of the current mirror circuits 52–53 and 57–58. The circuitry within transconductor circuit 51 and current mirror circuits 52–53 is equivalent to the circuitry within transconductor circuit 56 and current mirror circuits 57–58 . Accordingly, only the circuitry within transconductor circuit 51 and current mirror circuits 52–53 is described in detail below.

For each of the transconductor sections 26–29, the gain is determined primarily by (1) the value of the load resistor RLOAD at 62, and (2) the ratios of transistor pairs disposed within the current mirror circuits 52–53 and 57–58. With reference to FIG. 2, if the differential input voltage at 12–13 is represented by δV, if the differential gain from the transconductor circuits 51 and 56 is represented by $g_{m(n)}$, if the differential gain from the current mirrors 52 and 57 is represented by M1, and if the differential gain from the current mirrors 53 and 58 is represented by M2, the overall gain provided by any one of the transconductor sections 26–29 is as follows:

$$g_{T(n)} = g_{M(n)} \cdot_M 1 \cdot M2 \cdot \delta V.$$

Figure 3A:
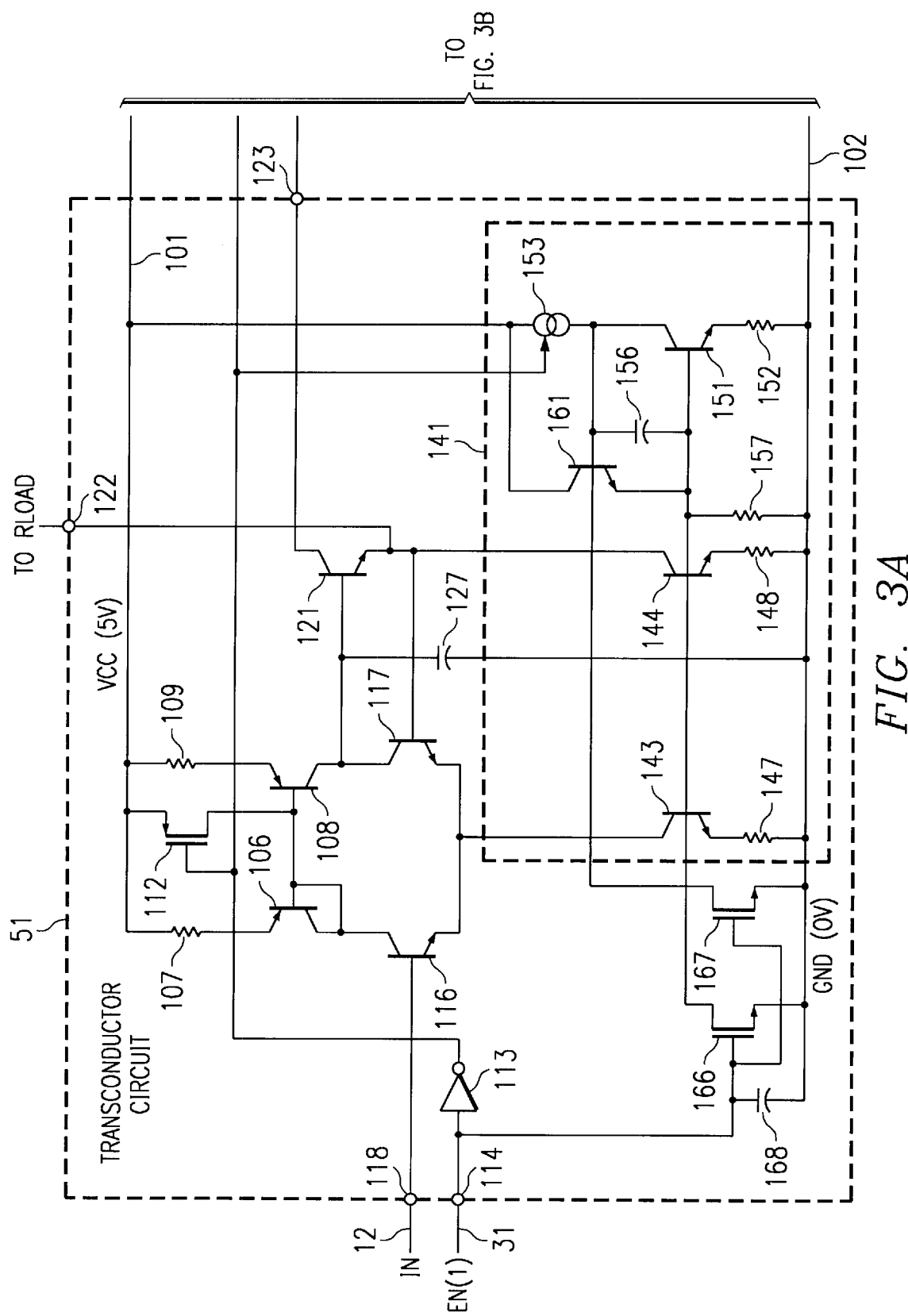
FIGS. 3A and 3B are schematic diagrams of the circuitry within the transconductor section shown in FIG. 2, and are collectively referred to hereinafter as FIG. 3.
Figure 3B:
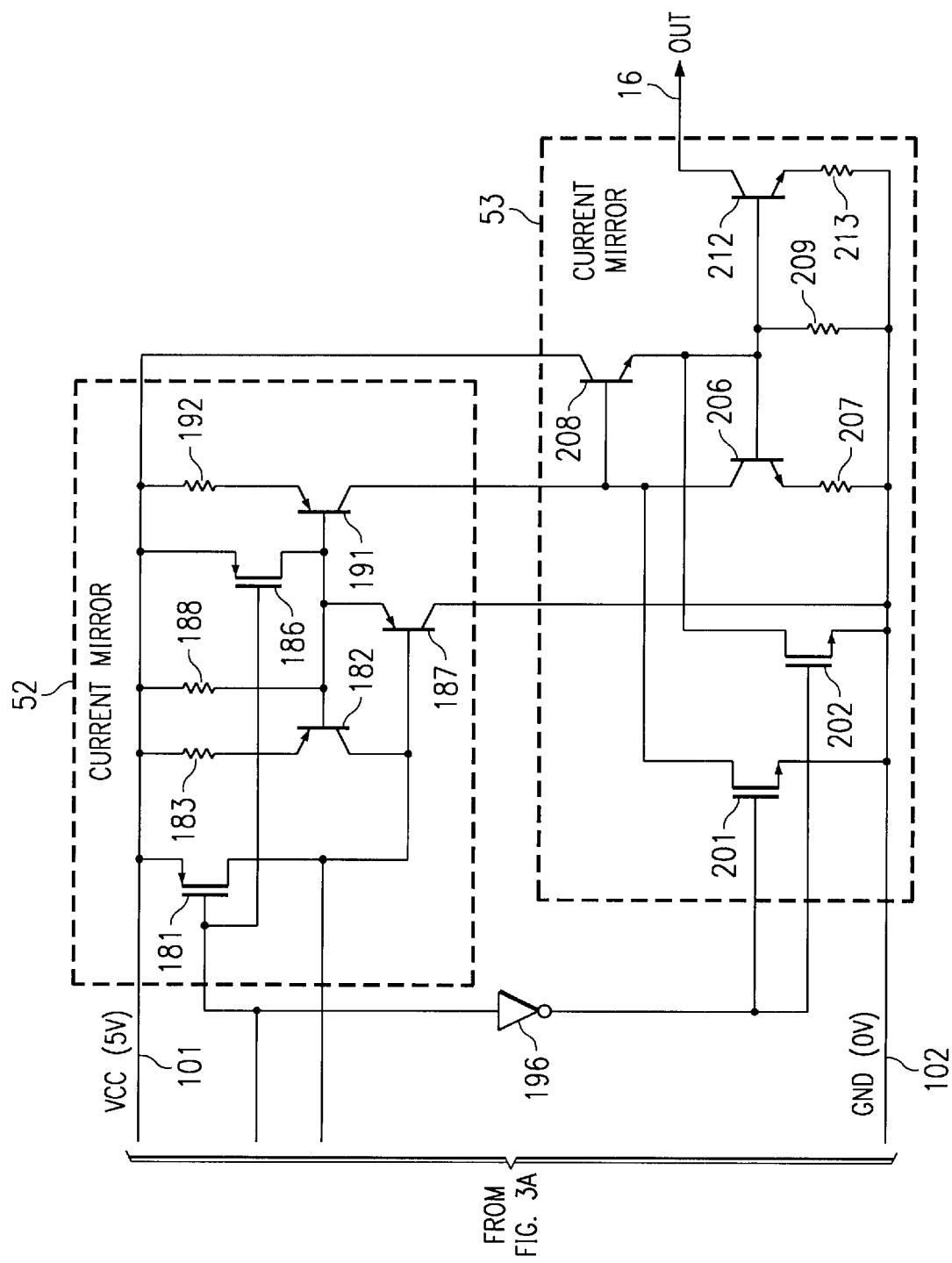

For convenience and clarity, FIGS. 3A and 3B are collectively referred to hereinafter as FIG. 3. FIG. 3 shows a detailed circuit schematic of the transconductor section 26, including the transconductor circuit 51, the current mirror 52 and the current mirror 53, each of which is circumscribed by a respective broken line in FIG. 3. The circuit of FIG. 3 operates from a supply potential of 5 volts DC, which is applied between VCC at 101 and ground (GND) at 102.

The transconductor circuit 51 includes a transistor 106 having an emitter which is coupled through a resistor 107 to VCC at 101. A further transistor 108 has its emitter coupled through a resistor 109 to VCC at 101. The transistors 106 and 108 are matched transistors. The base of transistor 106 is coupled to its collector, and to the base of transistor 108. A transistor 112 has its source coupled to VCC at 101. The drain of transistor 112 is coupled to the bases of transistors 106 and 108. An inverter 113 has its input coupled to an enable node 114 of the transconductor circuit 51, and its output coupled to the gate of transistor 112.

A transistor 116 has its collector coupled to the collector of transistor 106, and its base coupled to an input node 118 of the transconductor circuit 51. A transistor 117 has its collector coupled to the collector of transistor 108. The transistors 116 and 117 are matched. A transistor 121, which serves as an output stage of the transconductor circuit 51, has a base which is coupled to the collector of transistor 117, and an emitter which is coupled to the base of transistor 117 and to a load node 122. The collector of transistor 121 is coupled to an output node 123 of the transconductor circuit 51, and is not connected to any other point within the transconductor circuit 51. A capacitor 127 has its ends respectively coupled to the base of transistor 121, and to ground at 102.

The transconductor circuit 51 includes a current mirror circuit 141, which has two transistors 143 and 144 that each serve as a respective constant current source. The transistor 143 has its collector coupled to the emitters of each of the transistors 116 and 117, and has its emitter coupled through a resistor 147 to ground at 102. The transistor 144 has its collector coupled to the emitter of transistor 121, and its emitter coupled through a resistor 148 to ground.

The current mirror circuit 141 includes a further transistor 151, which has its emitter coupled through a resistor 152 to ground. The collector of transistor 151 is coupled through a constant current source circuit 153 to the supply voltage VCC at 101. The circuitry within the constant current source 153 is of a known type, and therefore not illustrated and described here in detail. The constant current source 153 has an enable input, which is coupled to the output of the inverter 113.

The current mirror circuit 141 further includes a capacitor 156 which is coupled between the collector and base of transistor 151, and includes a resistor 157 which is coupled between the base of transistor 151 and ground at 102. A further transistor 161 of the current mirror circuit 141 has its collector coupled to the supply voltage VCC at 101, and its emitter coupled to the base of transistor 151. The transistors 143, 144 and 151 have their bases coupled together. The transistors 143 and 151 form a current mirror, and the transistors 144 and 151 also form a current mirror.

A transistor 166 has its source coupled to ground, and has its drain coupled to the bases of transistors 143, 144, and 151. A further transistor 167 has its source coupled to ground, and its drain coupled to the base of transistor 161 and the collector of transistor 151. The gates of the transistors 166 and 167 are each coupled to the enable node 114. A capacitor 168 is coupled between the gate of transistor 166 and ground at 102.

Turning to the current mirror circuit 52, a transistor 181 has its source coupled to the supply voltage VCC at 101, and its drain coupled to the output node 123 of the transconductor circuit 51. The gate of transistor 181 is coupled to the output of inverter 113. A further transistor 182 has its emitter coupled through a resistor 183 to the supply voltage VCC, and its collector coupled to the output node 123 of the transconductor circuit 51. A transistor 186 has its source coupled to the supply voltage VCC at 101, and its gate coupled to the output of inverter 113.

A transistor 187 has its emitter coupled to the drain of transistor 186 and the base of transistor 182. The transistor 187 has its base coupled to the output node 123 of transconductor circuit 51, and its collector coupled to ground at 102. A resistor 188 is coupled between the supply voltage VCC and the emitter of transistor 187. A transistor 191 has its emitter coupled through a resistor 192 to the supply voltage VCC, and its base coupled to the base of transistor 182. The collector of transistor 191 serves as an output of current mirror circuit 52. The transistors 182 and 191 form a current mirror, with a current ratio that determines the gain of the current mirror circuit 52.

An inverter 196 has its input coupled to the output of inverter 113. The current mirror circuit 53 has a transistor 201 with its source coupled to ground at 102, and its gate coupled to the output of inverter 196. The drain of transistor 201 is coupled to the collector of transistor 191. A transistor 202 has its source coupled to ground at 102, and its gate coupled to the output of inverter 196. A transistor 206 has its collector coupled to the collector of transistor 191, and its emitter coupled through a resistor 207 to ground at 102.

A transistor 208 has its collector coupled to the supply voltage VCC at 101, and its emitter coupled through a resistor 209 to ground at 102. The emitter of transistor 208 is also coupled to the base of transistor 206, and the drain of transistor 202. The base of transistor 208 is coupled to the collector of transistor 206. A transistor 212 has its base coupled to the base of transistor 206, and its emitter coupled through a resistor 213 to ground at 102. The collector of transistor 212 is not coupled to any other circuit elements, and serves as an output of the current mirror circuit 53. More specifically, the collector of transistor 212 is coupled to the differential output terminal 16 of the programmable gain amplifier 10 of FIG. 1. The transistors 206 and 212 form a current mirror, with a current ratio that determines the gain of the current mirror circuit 53.

The operation of the circuitry shown in FIG. 3 will now be described. It is initially assumed that the enable input EN(1) is enabling the circuitry to operate. The transistors 106, 108, 116, 117 and 121 form a closed loop voltage amplifier which is suitably biased by two current sources that are respectively defined by the transistors 143 and 144. The amplifier has a gain of unity, as measured at the base of transistor 116 and at the emitter of transistor 121. The voltage at the emitter of the transistor 121 causes a current to flow through the load resistor 62 (FIG. 2), thereby converting the voltage into a current which flows through node 123, transistor 121, and the load resistor 62, thus producing an output current at the output node 123. Transistor 121 thus operates as a common base stage, transferring the load current from its emitter to its collector, where it serves as the output current. The transistor 121 has the effect of converting a low impedance at its emitter at a high impedance at its collector.

As mentioned above, the gain of the transconductor section 26 is determined in part by the value of the load resistor 62. This is because V=IR, and changing the value of the load resistor 62 will change the amount of current which flows through it, and thus the amount of current flowing through the output node 123.

Hypothetically, in order to convert the output current at node 123 into a voltage, a resistor could be coupled between the output node 123 and the supply voltage VCC at 101, so that the output current at node 123 would flow through that resistor and create an output voltage across it. However, for the indicated supply voltage of 5 volts, the circuit of the disclosed embodiment causes output node 123 to have an operating voltage of approximately three volts, such the voltage differential between the output node 123 and the supply voltage VCC is only about two volts. In order to increase the potential voltage swing and thus the voltage compliance, the disclosed embodiment takes the current at output node 123, and processes it successively in the two current mirror circuits 52 and 53.

In this regard, the first current mirror circuit 52 produces an output current at the collector of transistor 191, which operates at a voltage that is excess of three volts with respect to ground 102. If it was desired to have the output of the amplifier 10 referenced relative to ground, the current mirror circuit 53 could be omitted, and the collector of the transistor 191 could be directly used as the output 16 of the transconductor section 26. In the disclosed embodiment, however, it is desirable that the output of the amplifier 10 be referenced relative to the supply voltage VCC. Therefore, the second current mirror circuit 53 is provided in order to effectively invert the polarity so that the output is referenced relative to the supply voltage rather than ground. Consequently, the transistor 212 is functionally comparable to the transistor 121, except that the collector of transistor 212 operates at a lower voltage than the collector of transistor 121.

A further consideration is that, as mentioned above, the current mirror circuits 52 and 53 also help determine the overall gain of the transconductor section 26. This is implemented by appropriately choosing the current ratio of the transistor pair 182 and 191 in current mirror circuit 52, and the current ratio of the transistor pair 206 and 212 in the current mirror circuit 53. In order to maximize bandwidth in a current mirror circuit, it is desirable to avoid using a current ratio which is too big. Therefore, even though the disclosed embodiment uses only two current mirror circuits 52 and 53, it would be possible to use even more current mirror circuits, so that each current mirror circuit can have a relatively small current ratio that maintains a wide bandwidth, while achieving a relatively large gain defined by the sum of the various small current ratios. Further, by selectively using either an odd or even number of current mirror circuits, the output can arbitrarily be referenced to either the supply voltage or ground. The current mirror circuits 52 and 53 each provide a good combination of gain accuracy, voltage compliance and wide bandwidth.

Returning to FIG. 1, and as discussed above, each of the N+1 transconductor sections 26–29 has a respective different gain. For a given input voltage level, the transconductor sections which have smaller gains will produce outputs with smaller voltage swings than the transconductor sections which have larger gains. If each of the transconductor sections was operating with the same class A quiescent current for the transistor 121, the transconductor sections with progressively smaller gains would have corresponding progressive decreases in their modulation indexes, which in turn would produce corresponding decreases in distortion.

However, for purposes of the disclosed embodiment, there is no need for the various transconductor sections 26–29 to have different modulation indexes and distortion levels. Consequently, in accord with the present invention, the class A quiescent current used for the transistors 121 in each of the transconductor sections 26–29 is different, in proportion to their respective gains, but the transistors 121 have modulation indexes and distortion levels which are substantially the same. This permits other characteristics to be optimized.

More specifically, it is known in the art that, in order to maximize the switching speed and thus the bandwidth of a transistor, while minimizing power consumption and noise, the transistor should be operated at an optimum current density in terms of amperes per unit of area. Consequently, according to the present invention, transistors in the transconductor circuit 51, especially the transistor 121, are each designed to have a physical size which is optimum for the particular current of that particular transistor. As noted above, the disclosed embodiment is implemented in an integrated circuit, and thus different transistor sizes can readily be fabricated for each of the transconductor sections 26–29. Those skilled in the art are thoroughly familiar with how to configure the physical size of a transistor so as to optimize its current density.

As a result of the separate optimization of circuitry in each transconductor section, it is possible to maintain, even over a large gain range, approximately constant distortion and a wide and approximately constant bandwidth, while reducing each of supply current, shot noise associated with output devices, and glitch energy produced at the output when the transconductor section is enabled or disabled. Further, by using transconductor sections that output currents rather voltages, the outputs of the various transconductor sections can be directly connected together, in order to generate the final output signal, while avoiding multiplexers or other switches in the signal path, and the degradation in performance associated with them.

As discussed above, the transconductor sections 26–29 of FIG. 1 each have another operational mode, in which they are disabled by the corresponding line EN(n) of the enable bus 21. Referring to FIG. 3, which shows the transconductor section 26, the disable is effected primarily by disabling the constant current source 153, which has an enable input coupled through inverter 113 to the enable line EN(1) of the bus 21. When the current source 153 is disabled, no current flows through it, as a result of which no current flows through the transistor 151. Since the transistor 151 forms a respective current mirror with each of the transistors 143 and 144, there will be no current flowing through either of the transistors 143 and 144, which effectively shuts off the entire transconductor section 26, because there is no current flow through the transistor 121 that serves as an output transistor, or through any of the transistors 106, 108, 116 or 117.

In the real world, however, there maybe non-ideal factors such as noise glitches which could affect this. Accordingly, in order to ensure that the transconductor section 26 is completely disabled, some additional provisions have been implemented. This includes the transistor 112, which is turned on when the transconductor section 26 is disabled, so as to couple the bases of the transistors 106 and 108 to the supply voltage VCC, and thus keep transistors 106 and 108 turned off. Similarly, transistors 166 and 167 are provided, and are turned on in the disable mode, in order to help shut off the current mirror circuit 141 so that no current flows through the transistors 116, 117 and 121. Further, transistor 181 in the current mirror circuit 52 and transistors 201–202 in the current mirror circuit 53 are provided to ensure that the current mirror circuits 52 and 53 are completely off while the transconductor section 26 is disabled.

The present invention provides a number of technical advantages. One such technical advantage is that, through the use of transconductor sections that have outputs which are connected to each other, a programmable gain amplifier can be implemented while avoiding the use of multiplexers or other switches, and thus avoiding the degradation in performance which is associated with multiplexers or switches. Further, where each transconductor section is optimized for its own gain setting, operation over a wide and constant bandwidth is possible, while maintaining a constant level of distortion, and while reducing overall supply current, overall noise, the shot noise associated with output devices, and the glitch energy which occurs at the output of a transconductor section that is being able enabled or disabled.

Still another advantage results from the use of multiple current mirrors. The current mirrors can help define the gain of the corresponding transconductor section, thereby reducing the range of overall load resistors that must be used. The use of multiple current mirrors permits the current ratio in each current mirror to be kept to a small value, in order to maintain a wide bandwidth, while still achieving a desired level of gain. Still another advantage is that the voltage compliance of the unit will be increased, and can be selectively referenced to either side of the supply voltage.

Although one embodiment has been illustrated and described in detail, it will be understood that various substitutions and alterations can be made therein without departing from the present invention. For example, the disclosed embodiment uses differential transconductor sections that have a suitable common node operating range. However, it will be recognized that the invention can also be used in other approaches, including a single-ended approach. A further example is that the disclosed embodiment uses two current mirror circuits for each side of the differential signal, but it will be recognized that, depending on the particular circumstances, it would be possible to use a larger or smaller number of current mirror circuits, or even no current mirror circuit at all.

Still another consideration is that one particular circuit has been disclosed for implementing the transconductor sections, but it will be recognized that there are a variety of other circuits which fall within the scope of the present invention and which could be used to implement a transconductor section. As one aspect of this, it will be recognized that direct connections disclosed herein could be altered, such that two disclosed components or elements would be coupled to one another through an intermediate device or devices without being directly connected, and while still realizing the present invention.

Other substitutions and alterations are also possible without departing from the spirit and scope of the present invention, as defined by the following claims.

What is claimed is:

1. An apparatus comprising a programmable gain amplifier having a signal input, a signal output, and a plurality of enable inputs, said amplifier including a plurality of transconductor sections which each have an input node coupled to said signal input, an output node coupled to said signal output, and an enable node coupled to a respective one of said enable inputs, said transconductor sections having respective gains which are different, and each said transconductor section being operable in one of first and second modes selected as a function of a signal at said enable node thereof, each said transconductor section being respectively enabled and disabled when in said first and second modes thereof, said transconductor section includes circuitry having a design which is optimized for the respective said gain thereof, and said circuitry in each said transconductor section includes an amplifier having a transistor with a class A quiescent current, said class A quiescent currents of said transconductor sections being different, and each said transistor being sized to have an optimum current density with respect to said class A quiescent current thereof.

2. An apparatus according to claim 1, wherein said input nodes are high impedance inputs and are connected to each other, and wherein said output nodes are high impedance outputs and are connected to each other.

3. An apparatus according to claim 1,
wherein said amplifier has a further signal input and a further signal output, said signal inputs forming a differential pair and said signal outputs forming a differential pair; and
wherein said transconductor sections each have a further input node coupled to said further signal input, and a further output node coupled to said further signal output.

4. An apparatus comprising a programmable gain amplifier having a signal input, a signal output, and a plurality of enable inputs, said amplifier including a plurality of transconductor sections which each have an input node coupled to said signal input, an output node coupled to said signal output, and an enable node coupled to a respective one of said enable inputs, said transconductor sections having respective gains which are different, and each said transconductor section being operable in one of first and second modes selected as a function of a signal at said enable node thereof, each said transconductor section being respectively enabled and disabled when in said first and second modes thereof;
said amplifier has a further signal input and a further signal output, said signal inputs forming a differential pair and said signal outputs forming a differential pair;
said transconductor sections each have a further input node coupled to said further signal input, and a further output node coupled to said further signal output; and
each said transconductor section includes:
first and second transconductor circuits which each have an input coupled to a respective said input node of the transconductor section, and which each have an output; and
first and second current mirror sections which each have an input coupled to said output of a respective one of said transconductor circuits, and which each have an output coupled to a respective said output node of the transconductor section.

5. An apparatus according to claim 4, including a load resistor coupled between said first and second transconductor circuits.

6. An apparatus according to claim 5, wherein said first and second transconductor circuits each include a transistor which is coupled between said output thereof and a respective end of said resistor.

7. An apparatus according to claim 4, wherein each of said first and second current mirror sections includes a plurality of current mirror circuits coupled in series between said input and said output of the current mirror section.

8. An apparatus according to claim 7, wherein said enable node of each said transconductor section is coupled to each of said transconductor circuits and each of said current mirror circuits of that transconductor section.

9. An apparatus comprising a programmable gain amplifier having a signal input, a signal output, and a plurality of enable inputs, said amplifier including a plurality of transconductor sections which each have an input node coupled to said signal input, an output node coupled to said signal output, and an enable node coupled to a respective one of said enable inputs, said transconductor sections having respective gains which are different, and each said transconductor section being operable in one of first and second modes selected as a function of a signal at said enable node thereof, each said transconductor section being respectively enabled and disabled when in said first and second modes thereof, and wherein one of said transconductor sections has a predetermined gain, and wherein each said transconductor section other than said one transconductor section has a gain which differs from said selected gain by a factor which is a respective power of two.

10. A method of operating a programmable gain amplifier which has a plurality of transconductor sections that each have an input node, an output node and an enable node, comprising the steps of:
applying to said enable node of each said transconductor section a respective one of a plurality of enable signals that can each be selectively set to have one of first and second states;
applying a common input signal to said input nodes of each of said transconductor sections;
causing each said transconductor section to inhibit current flow at said output node thereof when the corresponding enable signal is in said first state;

causing each said transconductor section to produce at said output node thereof an output current when the corresponding enable signal is in said second state, said output current being proportional to a voltage of said input signal according to a gain, said gains of said transconductor sections being different;

forming an output signal by summing the output currents from said output nodes of said transconductor sections; and sizing a transistor of each said transconductor section to have an optimum current density with respect to a class A quiescent current flowing there through.

11. A method according to claim 10, including the step of optimizing a circuit design of each said transconductor section for the respective said gain thereof.

12. An apparatus comprising a transconductor circuit having an input node, an output node, and circuitry coupled between said input and output nodes, said circuitry being responsive to an input voltage at said input node for generating an output current at said output node, and said circuitry including a transistor which has first, second and third terminals, said second terminal being a control terminal, said second and third terminals each being coupled to other components of said circuitry, and said first terminal serving as said output node and being free of connections within said circuitry, and the transconductor circuit has a load node that can be coupled to a load, and wherein said third terminal is coupled to said load node.

13. An apparatus comprising a transconductor circuit having an input node, an output node, and circuitry coupled between said input and output nodes, said circuitry being responsive to an input voltage at said input node for generating an output current at said output node, and said circuitry including a transistor which has first, second and third terminals, said second terminal being a control terminal, said second and third terminals each being coupled to other components of said circuitry, and said first terminal serving as said output node and being free of connections within said circuitry; and said circuitry includes second and third transistors coupled in series across a supply voltage, and fourth and fifth transistors coupled in series across said supply voltage, said second and fourth transistors having control terminals coupled to each other and to a node between said second and fourth transistors, said third transistor having a control terminal coupled to said input node, said fifth transistor having a control terminal coupled to said third terminal of said first transistor, and said control terminal of said first transistor being coupled to a node between said fourth and fifth transistors.

14. An apparatus according to claim 13, including:

a first current source coupled in series with said second and third transistors and coupled in series with said fourth and fifth transistors: and a second current source coupled in series with said first transistor.

15. An apparatus according to claim 14, wherein said transconductor circuit includes:

an enable node; and further circuitry responsive to said enable node for selectively enabling and disabling said second current source.

16. An apparatus according to claim 15, wherein said further circuitry is responsive to said enable node for selectively enabling and disabling said first current source.

17. An apparatus according to claim 16, wherein said further circuitry includes a further transistor which is coupled between one side of said supply voltage and said control terminal of said second transistor, said further transistor having a control terminal coupled to said enable node.

18. An apparatus comprising a transconductor circuit having an input node, an output node, and circuitry coupled between said input and output nodes, said circuitry being responsive to an input voltage at said input node for generating an output current at said output node, and said circuitry including a transistor which has first, second and third terminals, said second terminal being a control terminal, said second and third terminals each being coupled to other components of said circuitry, and said first terminal serving as said output node and being free of connections within said circuitry; and a current mirror circuit having an input and an output, said input of said current mirror circuit being coupled to said output node of said transconductor circuit.

* * * * *

UNITED STATES PATENT AND TRADEMARK OFFICE
CERTIFICATE OF CORRECTION

PATENT NO. : 6,518,839 B2
DATED : February 11, 2003
INVENTOR(S) : Neil Gibson et al.

It is certified that error appears in the above-identified patent and that said Letters Patent is hereby corrected as shown below:

<u>Title page,</u>
Item [73], should read:
-- [73] Assignee: Texas Instruments Incorporated, Dallas, TX (US) --

Signed and Sealed this

Third Day of June, 2003

JAMES E. ROGAN
*Director of the United States Patent and Trademark Office*